United States Patent [19]
Villaume

[11] Patent Number: 5,285,350
[45] Date of Patent: Feb. 8, 1994

[54] HEAT SINK PLATE FOR MULTIPLE SEMI-CONDUCTORS

[75] Inventor: Henry F. Villaume, Intervale, N.H.

[73] Assignee: Aavid Engineering, Inc., Laconia, N.H.

[21] Appl. No.: 937,470

[22] Filed: Aug. 28, 1992

[51] Int. Cl.$^5$ .............................................. H05K 7/20
[52] U.S. Cl. ................... 361/690; 165/80.3; 257/707; 361/704; 361/816; 454/184
[58] Field of Search ............... 257/706, 707, 712, 723; 174/35 R, 35 GC, 16.1; 165/146, 147, 185, 80.3; 361/382, 383, 386–389, 399, 424, 689, 690, 692, 704, 705, 707, 709, 752, 816; 454/1, 184

[56] References Cited

U.S. PATENT DOCUMENTS

| | | | |
|---|---|---|---|
| 4,327,398 | 4/1982 | Chistison | 361/384 |
| 4,393,436 | 7/1983 | Sugiura | 361/424 |
| 4,609,126 | 9/1986 | Janda | 220/374 |
| 4,914,551 | 4/1990 | Anschel | 361/386 |
| 5,105,336 | 4/1992 | Jacoby | 361/383 |
| 5,175,395 | 12/1992 | Moore | 174/35 R |

FOREIGN PATENT DOCUMENTS 2052164 1/1981 United Kingdom ............... 361/383

OTHER PUBLICATIONS

Thermal Coupler, IBM Tech Discl Bull, vol. 21 #2 Jul. 1978, Antonelli et al, p. 749.

*Primary Examiner*—Gerald P. Tolin
*Attorney, Agent, or Firm*—Fish & Richardson

[57] ABSTRACT

A heat sink comprising a thin plate made of a heat conducting material, which plate includes a series of small tapered chimneys extending therethrough, the plate being adapted to fit over and parallel to an entire circuit board, thermally connecting with the semiconductors on the board, the chimneys being spaced inbetween the semiconductors and facilitating natural or forced airflow from the area between the plate and the printed circuit board to the area outside by means of the low pressure drop created by their tapering, the heat sink taking very little vertical space in the electronics package including the printed circuit board while providing effective heat dissipation and shielding from electromagnetic radiation and/or radio frequency interference for the semiconductors on the board.

6 Claims, 2 Drawing Sheets

HEAT SINK PLATE FOR MULTIPLE SEMI-CONDUCTORS

FIELD OF THE INVENTION

This invention relates to the field of heat sinks and in particular to heat sinks for use in small electronic devices or devices in which there is little clearance for heat sinks.

BACKGROUND OF THE INVENTION

A great deal of effort in the electronics industry today is devoted to trying to produce the electronic product in the smallest possible package, while at the same time enhancing the product's performance. Nowhere is this trend more evident than in the computer field, where personal computers have become increasingly smaller over the last few years. At the same time, the manufacturers have also tried to make the smaller computers as fast and as powerful as possible. This creates a problem in terms of heat dissipation.

In general, the more powerful the electronic semiconductor, the more heat it generates. Unless the heat is dissipated, the semiconductor may fail. There are a variety of well known devices for dissipating such heat. These include various finned heat sinks, which dissipate heat through the surface area of metal fins, and which may be and often are in connection with computers used in conjunction with electric fans, which drive air through the fins to enhance their cooling effect. Other types of heat sinks are also used, as well as other cooling devices such as cooling tubes, which extend around the devices and which carry a flow of some cooling medium. The problem with these existing devices is that they tend to take up a good deal of space. In fact, in many applications, the heat sinks, fans or other cooling devices take up more space than the semiconductors they are designed to cool. Moreover, these heat sinks and other related devices tend to take up "vertical" space. That is they tend to have a significant height, so that it becomes difficult to put them in a thin electronics package, at least without so severely downsizing them as to make them generally ineffective. By the same token, the effort to minimize the package for electronic devices such as portable computers by making them as thin and small as possible, while not sacrificing speed and power, makes the need for such heat dissipation means in these packages all the more acute.

Accordingly, an object of the invention is to provide a heat sink, which provides a significant amount of heat dissipation, while taking up very little space, particularly very little vertical space.

SUMMARY OF THE INVENTION

The invention here is a heat sink which comprises a thin plate made of a heat conducting material, which plate includes a series of small chimneys extending therethrough. The plate is adapted to fit over an entire circuit board, contacting the electronic semiconductors on the board, with the chimneys being spaced inbetween. The chimneys are designed to facilitate natural or forced airflow through the plate by reducing the pressure drop associated with such openings. When in use, the heat sink of this invention takes up virtually no vertical space, while providing effective heat dissipation for a variety of electronic components on a board.

In the preferred embodiment, a heat sink according to the invention comprises a flat copper plate coated with an electrically insulating, black epoxy paint. The plate is sized in relation to the board on which it will be used, but six inches by 9 inches would be a common size. The plate is 20 thousandths inches thick. The heat sink includes a series of holes interspaced over its surface. The location of the holes depends upon the configuration of the electronic elements on the board to which the heat sink is intended to be applied. In general, however, the holes are disposed so as to be located above the pathways between the electronic devices on the board, once the heat sink is in place. The holes are not cylindrical. Instead, they have a wide bottom and curved, tapering sides extending upwardly to a narrower open top disposed about a tenth of an inch above the rest of the plate of the heat sink. The heat sink of the preferred embodiment also includes alignment holes to assure proper placement of the heat sink on the board over the electronic devices. Proper placement is also aided by a series of indents on the underside of the heat sink, which indents serve to help properly align the heat sink with the electronic devices over which the heat sink is to be placed. The heat sink is held to the board by connectors at its corners, and double-faced, heat conductive tape attaches the semiconductive devices on the board to the underside of the heat sink of this invention. In operation, the heat sink dissipates heat from all the electronic devices on the board to which the heat sink is attached, and the holes or chimneys provide airflow passages with low pressure drops to facilitate cooling airflow around the electronic devices to further dissipate the heat they generate. At the same time, the heat sink of this invention takes up very little vertical space on the board.

DESCRIPTION OF THE PREFERRED EMBODIMENT

I turn now to a complete description of the preferred embodiment, after first briefly describing the drawings.

STRUCTURE

Figure 1:
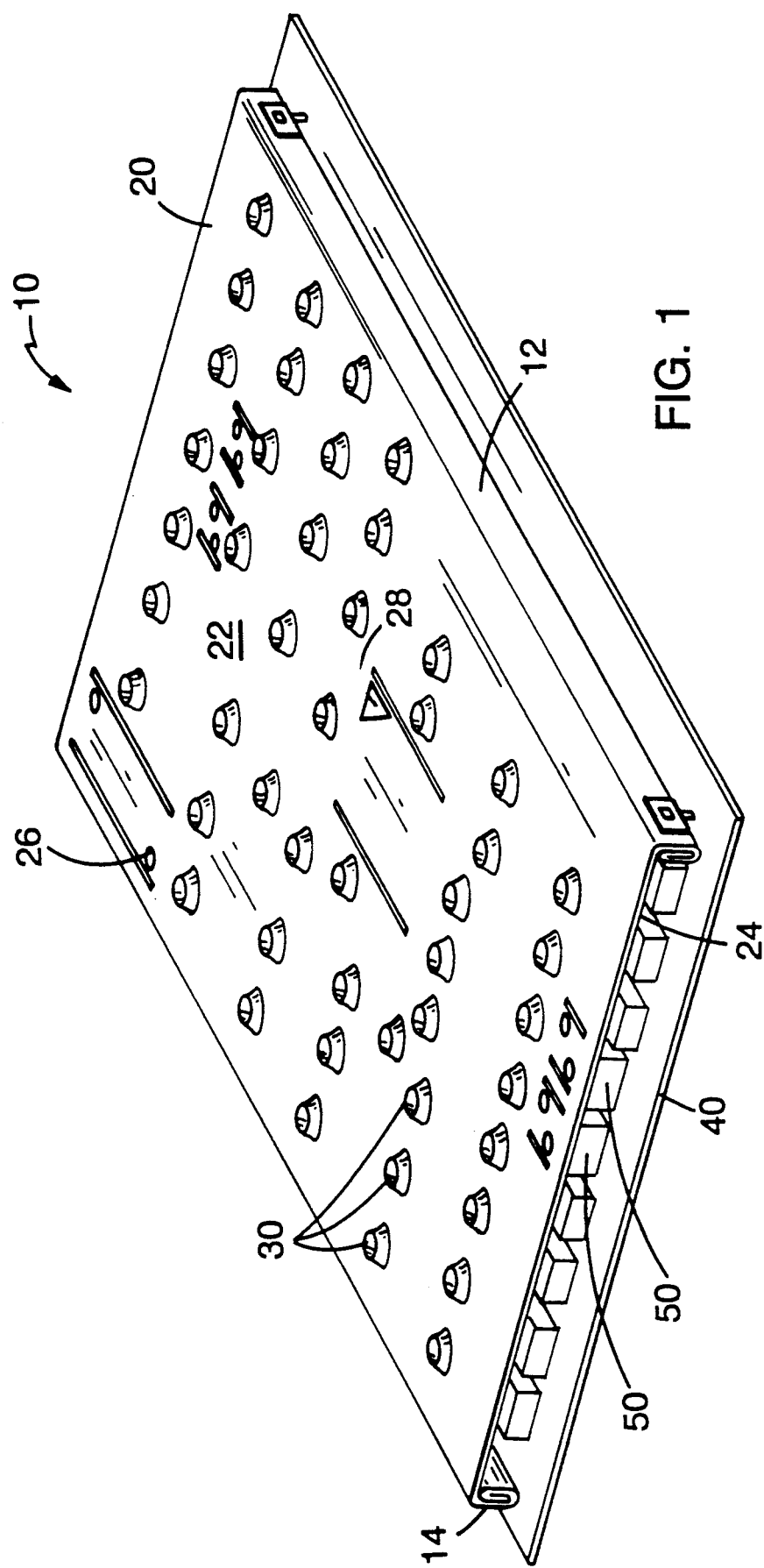
FIG. 1 is a perspective view of a heat sink according to this invention mounted on a printed circuit board.

Referring to FIG. 1, a heat sink according to the invention is shown at 10. The heat sink 10 generally comprises a plate 20 having a top surface 22 and a bottom surface 24, with a series of chimneys 30 extending therethrough. The heat sink 10 is shown in FIG. 1 attached to a printed circuit board 40, upon which is mounted a number of semiconductor devices 50 (only partially shown in FIG. 1).

Figure 2:
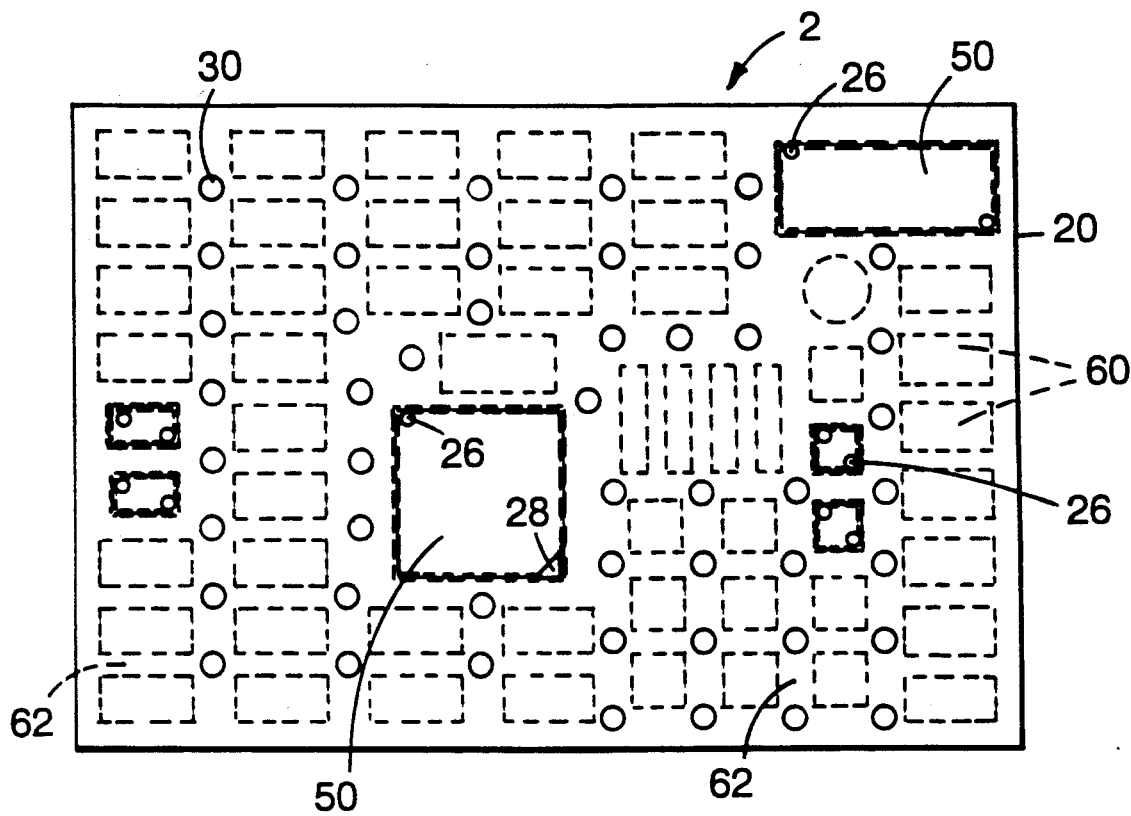
FIG. 2 is a top view of the heat sink of FIG. 1.

Referring to FIGS. 1 and 2, the plate 20 is rectangular and has approximately the same length and width as the printed circuit board 40. In the preferred embodiment, these dimensions are six inches by nine inches. Other sizes and shapes are possible without departing from the invention herein, and it is not always necessary for the heat sink 10 to cover the entire printed circuit board 40. The plate 20 is made of copper in the preferred embodiment and is about 0.020 inches thick. Other materials may, of course, be used. For example, aluminum may be used for applications where the heat needed to be dissipated is not as great, or where a lighter material is needed. Other metals may also be used. The plate 20 is coated with a black epoxy paint which provides electrical but not thermal insulation. Such a paint is CC3-341 from Cast Coat, Inc. of West Bridgewater, Mass. The paint covers the entire plate 20 including both the top surface 22 and the bottom surface 24.

Figure 3:
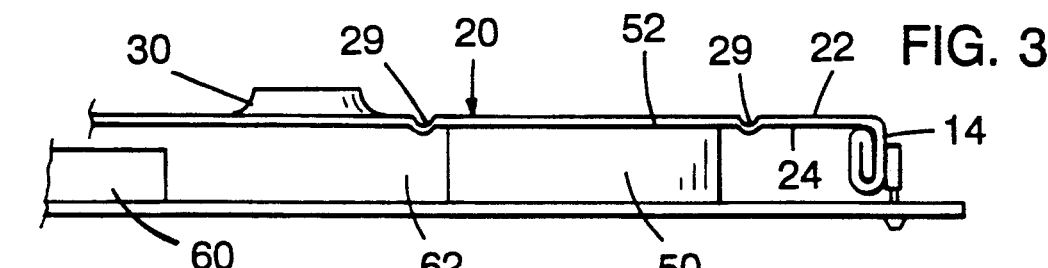
FIG. 3 is an expanded view of a portion of the side of the heat sink of FIG. 1.
Figure 4:
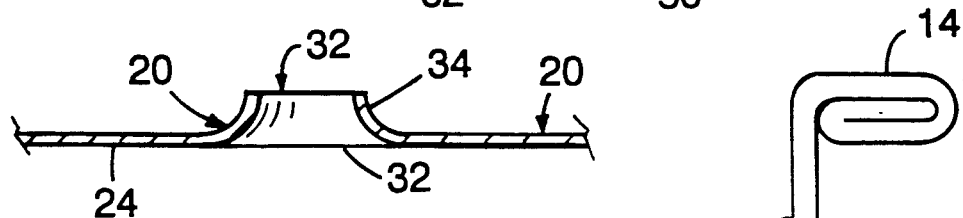
FIG. 4 is an expanded view of one of the chimneys of the heat sink of FIG. 1.

As shown in FIGS. 3 and 4, all the chimneys 30 on the plate 20 are identical and generally conical in cross section. Each such chimney 30 has a bottom opening 32 disposed on the bottom surface 24 of the plate. In the preferred embodiment, the diameter of the bottom opening is 0.400 inches for each chimney, although other dimensions are possible. As best shown in FIG. 4, each chimney 30 has an inwardly curved sidewall 34 which extends from the bottom opening 32 to a top opening 36. The top opening has a diameter of 0.200 inches in the preferred embodiment, and the sidewall 34 extends 0.100 inches above the top surface 22. Other dimensions are possible here. With these dimensions, however, the chimney 30 has an internal area several times greater than that of a hole with a 0.200 inch diameter through the plate 20. In the preferred embodiment, the chimneys 30 are created by a conventional extrusion process.

As best shown in FIG. 2, the placement of the chimneys 30 is not random. In FIG. 2, there is shown in dotted display beneath the plate 20, the location of the semiconductor devices 50 to be cooled by the heat sink 10. Also shown in dotted display is the location of other electronic components 60 mounted on the particular printed circuit board 40 shown in the Figures. This configuration of semiconductors 50 and other electronic components 60 depends upon the printed circuit board 40 with which the heat sink 10 is to be used. The arrangement shown here is for illustrative purposes only. As is typical of many printed circuit boards, the semiconductors 50 and other electronic components 60 are arranged more or less in rows so that open, air-flow passageways 62 exist between components. In general, as shown in FIG. 2, the chimneys 30 are disposed in the plate 20 above the intersection of such passageways 62 on the board 40 and above otherwise open areas on the board 40.

As also shown in FIG. 2, the plate 20 has a series of location holes 26 therethrough. The location holes 26 are disposed over opposite corners of the semiconductors 50 when the heat sink 10 is properly aligned over the board 40. The holes 26 allow a visual means by which this alignment can be determined. The location of the hole 26 depends, of course, on the location of the semiconductors 50 on the particular board 40 and thus may vary from board to board. In addition, for key semiconductors, such as microprocessors, a triangular inspection hole 28 is provided so that a visual inspection of pin number one of the microprocessor may be made when the heat sink 10 is in place so that it can be determined whether or not pin one on the device is properly positioned.

As shown in FIG. 3, another alignment means is provided in the form of ridges 29 which extend from the bottom surface 24 of the plate 20. The ridges, which are about 0.030 inches high in the preferred embodiment, are disposed to be adjacent to each semiconductor 50. As a result, when the heat sink 10 is put in place, the ridges 29 provide a guide for correct positioning over the semiconductors 50.

Figure 5:
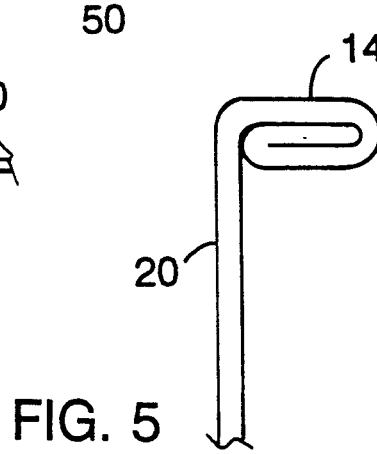
FIG. 5 is an expanded view of an edge of the heat sink of FIG. 1.

As shown in FIGS. 1 and 5, the heat sink 10 has a pair of sides 12, 14. The sides 12, 14 extend down the lengthwise sides of the plate 20. As shown in FIG. 5, the sides 12, 14 are formed by folding over the edges of the plate 20, although other means could be used. Connectors 16 are attached to the sides 12, 14 at their ends, and the connectors 16 are used to attach the heat sink 10 to the printed circuit board 40. Any standard type of connector may be used. The connectors used in the preferred embodiment are of the type covered by U.S. patent application Ser. No. 804,804, filed on Dec. 9, 1991. As a result of this configuration with the sides 12, 14, the heat sink 10 is open at each widthwise end.

It is also possible to have the sides 12, 14 extend completely around the plate 20 so as to partially close off the ends. While this restricts airflow somewhat, it is useful in situations where the board needs to be shielded from electro-magnetic radiation (EMR) or radio frequency interference (RFI).

OPERATION

In operation, the heat sink 10 is made so that the chimneys 30, inspection holes 26, 28 and ridges 29 correspond, as indicated previously, to the configuration of the printed circuit board 40 on which the heat sink 10 is to be used. The semiconductors 50, which are to be attached directly to the heat sink 10, each have a piece of double-sided, heat conductive tape 52 placed on its exposed upper surface. The heat sink 10 is then lined up with the semiconductors 50 using the ridges 29 and inspection holes 26, 28. When properly aligned, the connectors 16 are attached to the board 40 by inserting them into holes (not shown) in the board, and the heat sink 10 is then attached to the board 40. The tape 52 thermally connects the semiconductors 50 to the bottom surface 24 of the plate 20 of the heat sink 10. In operation, heat from the semiconductors 50 is dissipated by the heat sink, which has a significant amount of surface area compared to the semiconductors 50. In addition, to aid in the cooling, the configuration of the chimneys 30 creates a low pressure drop between the air adjacent to the bottom surface 24 and the top surface 22 of the plate 20. As a result, air flows easily up through the chimneys 30 from the underside of the plate 10 to the upper side, by means of natural convection, without the need for forced air blowing. Of course, forced air blowing may be used with the heat sink 10 of this invention, and applied at one of the open ends not covered by a side 12, 14.

Other embodiments will occur to those skilled in the art.

What I claim is:

1. A heat sink dissipating heat from one or more semiconductors on a printed circuit board comprising:
   a plate having a top surface and a bottom surface,
   said plate being made of heat conductive material and having said bottom surface contacting the semiconductors to be cooled,
   said plate having at least one chimney means, each said chimney means including a tapered sidewall defining a first opening in said plate and a smaller second opening away from said plate, so as to convect heated air from the area adjacent to said bottom surface of said plate to the area adjacent to said top surface,
   attachment means connecting said bottom surface of said plate to the semiconductors so that said plate conducts heat generated by the semiconductors when the semiconductors are in operation, and connecting means connecting said plate to a printed circuit board.

2. The heat sink of claim 1 wherein said plate is generally rectangular and adapted to extend parallel to a printed circuit board on which the semiconductors are mounted when said plate is in place.

3. The heat sink of claim 2 wherein each said chimney means is disposed at a location on said plate, which location corresponds in general to an open space on the printed circuit board when said heat sink is in place.

4. The heat sink of claim 1 wherein said plate has at least one inspection hole, each adapted to allow viewing of a portion of one of the semiconductors when said heat sink is in place.

5. The heat sink of claim 1 wherein said plate has ridge means on said bottom surface adapted to align said heat sink with the semiconductors.

6. The heat sink of claim 1 wherein said plate has at least one pair of sidewalls.

* * * * *